(12) United States Patent
Kramer

(10) Patent No.: US 6,535,044 B2
(45) Date of Patent: Mar. 18, 2003

(54) CLOCK SIGNAL GENERATOR

(75) Inventor: Ronalf Kramer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,919

(22) Filed: Jul. 3, 2001

(65) Prior Publication Data

US 2002/0070785 A1 Jun. 13, 2002

(30) Foreign Application Priority Data

Jul. 7, 2000 (DE) .......................... 100 33 109

(51) Int. Cl.⁷ ................................. G06F 1/04
(52) U.S. Cl. ................. 327/291; 327/155; 327/159; 327/166; 365/233; 375/371
(58) Field of Search ................ 327/291–294, 327/297, 261, 263, 270, 165, 166, 99, 154–155, 149, 150, 152, 159, 160, 161; 375/371; 365/233, 233.5; 331/DIG. 2; 348/505, 508

(56) References Cited

U.S. PATENT DOCUMENTS 4,686,560 A * 8/1987 Balaban et al. ............. 348/508
4,802,009 A * 1/1989 Hartmeier .................... 331/25
5,067,138 A  11/1991 Van Rens et al. ........... 375/327
5,337,335 A * 8/1994 Cloetens et al. ............ 327/156
6,330,034 B1 * 12/2001 Renner et al. .............. 348/505

FOREIGN PATENT DOCUMENTS

| WO | WO 99/13579 | 3/1999 | ............ H03L/7/099 |
| WO | WO 99/33182 | 7/1999 | ............. H03L/7/22 |

* cited by examiner

Primary Examiner—Timothy P. Callahan
Assistant Examiner—Minh Nguyen
(74) Attorney, Agent, or Firm—Fish & Richardson P.C.

(57) ABSTRACT

A clock signal generator for generating a clock signal with minimum phase jitter at a clock signal generator output (41), the clock signal generator (1) having: a DT oscillator (4) which is clocked with an input clock signal and generates a periodic digital DTO output signal, a phase displacement calculation unit (12) for calculating the phase displacement between the signal phase of the DTO output signal and the signal phase of the most significant bit MSB of the DTO output signal, and a phase displacement reduction unit for reducing the phase displacement between the signal phase of the DTO output signal and the signal phase of the most significant bit MSB of the DTO output signal as a function of the calculated phase displacement, the most significant bit MSB being output with reduced phase displacement as a clock signal to the clock signal generator output (41).

28 Claims, 6 Drawing Sheets

CLOCK SIGNAL GENERATOR

The invention relates to a clock signal generator for generating a clock signal with minimum phase jitter.

BACKGROUND

The generation of a clock signal by means of a DT oscillator (DTO: Discrete Timing Oscillator) is generally known.

FIG. 1 shows a DT oscillator according to the prior art, and said DT oscillator also forms part of the clock signal generator according to the invention. The DT oscillator is composed of an accumulator for adding a predefined digital incremental value which is present at a first signal input E of the accumulator to an accumulated digital value which is present at a second signal input of the accumulator and is buffered in a register of the DT oscillator. The register is connected to the output of the accumulator and is clocked with an input clock signal which has an input clock frequency $f_{in}$. If the accumulator output value is higher than the value $2^K-1$ which can be represented on the basis of the predefined bit width K, the "overflow value" $2^K$ is simply omitted.

The DTO output signal if the DT oscillator which is output at the output A is illustrated in FIG. 2. The DT oscillator outputs a sawtooth output signal. Here, each sawtooth of the sawtooth output signal is composed of a plurality of steps with discrete amplitudes, the height of which corresponds to the incremental value applied and the width of which is determined by the clock period $1/f_{in}$ of the applied input clock signal. When the overflow value is exceeded, the next step of the output signal A has a value which is reduced by this overflow value (modulo operation).

The sawtooth DTO output signal of the DT oscillator has a frequency $f_{out}$ in accordance with the following equation:

$$f_{out}=f_{in}*\text{incremental/overflow value} \tag{1}$$

If the frequency of the input clock signal $f_{in}$ is very high in comparison with the frequency of the output clock signal $f_{out}$, the most significant bit MSB of the DTO output signal can be used directly as a clock output signal. The direct use of the most significant bit MSB of the DT oscillator means that this method of implementation requires very little expenditure in terms of circuitry. However, the direct use of the most significant bit MSB of the digital output signal of the DT oscillator has the disadvantage that relatively high phase jitter occurs.

FIG. 3 shows the cause of the phase jitter which occurs at the signal output A of the DT oscillator illustrated in FIG. 1. The DTO output signal is represented by sampled values. The position of the sampling times migrates over the sawtooth output signal of the DT oscillator because the ratio of the output frequency $f_{out}$ to the clock frequency of the input signal $f_{in}$ is rational. The most significant bit MSB of the DT oscillator which is used as the output clock signal changes at a sampling time. The change in the most significant bit MSB of the DT oscillator, and thus the signal edges of the output clock signal, therefore deviate from the ideal phase relation. The ideal phase relation is given by that time at which the sawtooth output signal of the DT oscillator jumps from the overflow value to the value 0.

The case A illustrated in FIG. 3, with the sampled values $a_1$, $a_2$, constitutes one of the limiting cases, while the case B with the sampled values $b_1$, $b_2$ shows the other limiting case. In the limiting case shown in case A, the sampled value $a_1$ lies precisely at the value of the overflow value/incremental value. As a result of the incremental value being added to the sampled value $a_1$, the sawtooth output signal reaches precisely the overflow value, with the result that the sawtooth output signal jumps back to the sampled value $a_2$, that is to say to the digital value 0.

In the limiting case shown in case B, the sawtooth output signal has the sampled value $b_1$ which corresponds precisely to the overflow value −1. As a result of the incremental value being accumulated, an overflow occurs and the digital value $b_2$ is output at the output of the DT oscillator.

As is apparent from FIG. 3, the maximum phase jitter is:

$$\text{Jitter}_{max}=1/f_{in} \tag{2}$$

The higher the input clock frequency $f_{in}$, the lower the phase displacement. However, the frequency of the input clock signal which is generated for example by a quartz oscillator and an analog pLL circuit can be increased only to a limited degree.

FIG. 4 shows an example of the phase displacements which occur with a conventional DT oscillator in which the ratio of the input frequency $f_{in}$ of the input clock signal with respect to the frequency of the output clock signal $f_{out}$ is 3.4. FIG. 4 shows a sawtooth profile of the DTO output signal and the signal profile of the associated most significant bit MSB of the DT oscillator.

The ideal phase relation is determined by the time at which an overflow occurs in the DT oscillator and the digital output signal jumps back to the value 0. The real phase relation of the DT oscillator is determined by the time at which the most significant bit MSB of the digital output signal has a falling signal edge.

SUMMARY

The following applies to the chronological displacement between the real phase relation $t_{real}$ and the ideal phase relation $t_{ideal}$:

$$\Delta t=t_{real}-t_{ideal}=T_{in}*DTO_{n0}/\text{incremental value} \tag{3}$$

$T_{in}$ being the clock period of the input clock signal, that is to say:

$$T_{in}=1/f_{in} \tag{4}$$

and $DTO_{n0}$ being the digital value of the DT oscillator after an overflow has occurred.

The DTO digital value after each overflow thus constitutes a measure of the time or phase displacement between the ideal signal phase of the DTO output signal and the signal phase of the most significant bit of the DTO output signal, it being possible to use the most significant bit MSB of the DTO output signal as a clock output signal.

For the chronological displacement after the DTO output value has the exceeded the value ½*overflow, the following applies:

$$\Delta t=t_{real}-t_{ideal}=T_{in}*(DTO_{nn0}-\tfrac{1}{2}\text{ overflow value })/\text{increment}$$

The object of the present invention is therefore to provide a clock signal generator for generating a clock signal with a minimum phase jitter, in which the clock signal acquired from the most significant signal bit of a DT oscillator has a minimum phase displacement with respect to the DTO output signal.

The invention provides a clock signal generator for generating a clock signal with minimum phase jitter at a clock signal generator output, the clock signal generator having:

a DT oscillator which is clocked with an input clock signal and which generates a periodic digital DTO output signal, a phase displacement calculation unit for calculating the phase displacement between the signal phase of the DTO output signal and the signal phase of the most significant bit of the DTO output signal, and a phase displacement reduction unit for reducing the phase displacement between the signal phase of the DTO output signal and the signal phase of the most significant bit of the DTO output signal as a function of the calculated phase displacement, the most significant bit being output with reduced signal displacement as a clock signal at the clock signal generator output.

The DT oscillator preferably has an accumulator for adding a digital incremental value which is present at a first signal input of the accumulator to a buffered accumulated digital value which is present at a second signal input of the accumulator.

The DT oscillator preferably has a register which is connected to a signal output of the accumulator in order to buffer the accumulated digital value.

The register of the DT oscillator is preferably clocked by the input clock signal with an input clock frequency $f_{in}$ in order to generate the digital DTO output signal.

The register of the DT oscillator is preferably reset if the accumulated digital value reaches a digital overflow value.

In one preferred embodiment of the clock signal generator according to the invention, the phase displacement calculation unit has a digital derivative unit which generates a clock pulse at each signal edge of the most significant bit of the DTO output signal.

The digital derivative unit of the phase displacement calculation unit preferably has here a plurality of gates and a register which is clocked by the input clock signal.

The phase displacement calculation unit preferably has a latch circuit for buffering the DTO output signal.

The latch circuit of the phase displacement calculation unit is preferably clocked here by the clock pulses which are generated by the digital derivative unit.

In one preferred embodiment of the clock signal generator according to the invention, the digital derivative unit preferably additionally generates a signal edge indicating signal which indicates, at each signal edge of the most significant bit of the DTO output signal, whether the signal edge is a rising or a falling signal edge.

The phase displacement calculation unit preferably has a logic circuit which subtracts, as a function of the signal edge indicating signal which is output by the digital derivative unit, half the overflow value or 0 from the DTO output signal buffered in the latch circuit, and divides the result of the subtraction by the incremental value in order to calculate a phase displacement signal which indicates the phase displacement between the signal phase of the DTO output signal and the signal phase of the most significant bit of the DTO output signal.

The phase displacement reduction unit of the clock signal generator according to the invention preferably delays the signal of the most significant bit MSB of the DTO output signal by means of a register chain, composed of a plurality of registers connected in series, in accordance with the signal delays occurring in the phase displacement calculation unit.

The registers of the register chain which are connected in series are preferably clocked by the input clock signal.

In one particularly preferred embodiment of the clock signal generator according to the invention, the signal, delayed by the register chain, of the most significant bit MSB of the DTO output signal is applied to a delay line, composed of a plurality of delay elements, of the phase displacement reduction unit.

In one particularly preferred embodiment, the phase displacement reduction unit has a multiplexer.

The multiplexer of the phase displacement reduction unit preferably has a plurality of multiplexer inputs which are each connected to a delay element output of a delay element of the delay line.

The multiplexer of the phase displacement reduction unit preferably has a multiplexer control input at which the phase displacement signal calculated by the phase displacement calculation unit is present.

The multiplexer preferably connects through a delay element output to the clock signal generator output as a function of the phase displacement signal which is present at the multiplexer control input.

In one particularly preferred embodiment, the delay elements of the delay line are delay elements of analog design.

In one alternative embodiment, the delay elements of the delay line are delay elements which are of digital design and which are clocked with the input clock signal.

In a further embodiment of the clock signal generator according to the invention, the signal, delayed by the register chain, of the most significant bit MSB of the DTO output signal is applied in parallel with the control of a plurality of latch circuits, each of whose inputs is connected to a signal phase of a multiphase clock, and each of whose outputs is connected to a signal input of the multiplexer.

Preferred embodiments of the clock signal generator according to the invention are described below with reference to the appended drawings in order to explain features which are essential to the invention.

DETAILED DESCRIPTION

Figure 1:
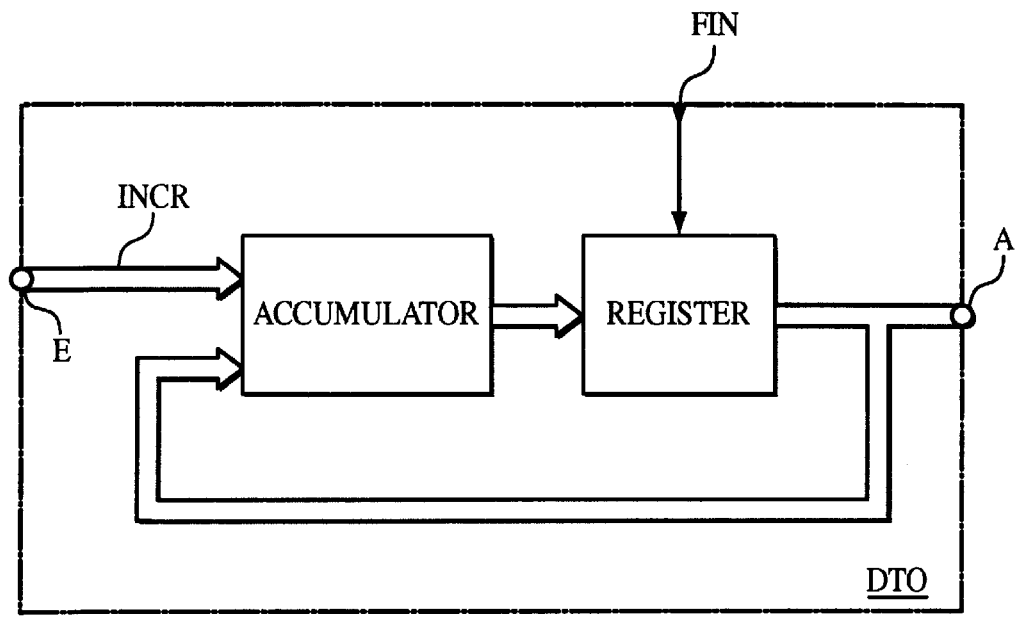
FIG. 1 shows a DT oscillator as claimed in the prior art, which forms part of the clock signal generator according to the invention.
Figure 2:
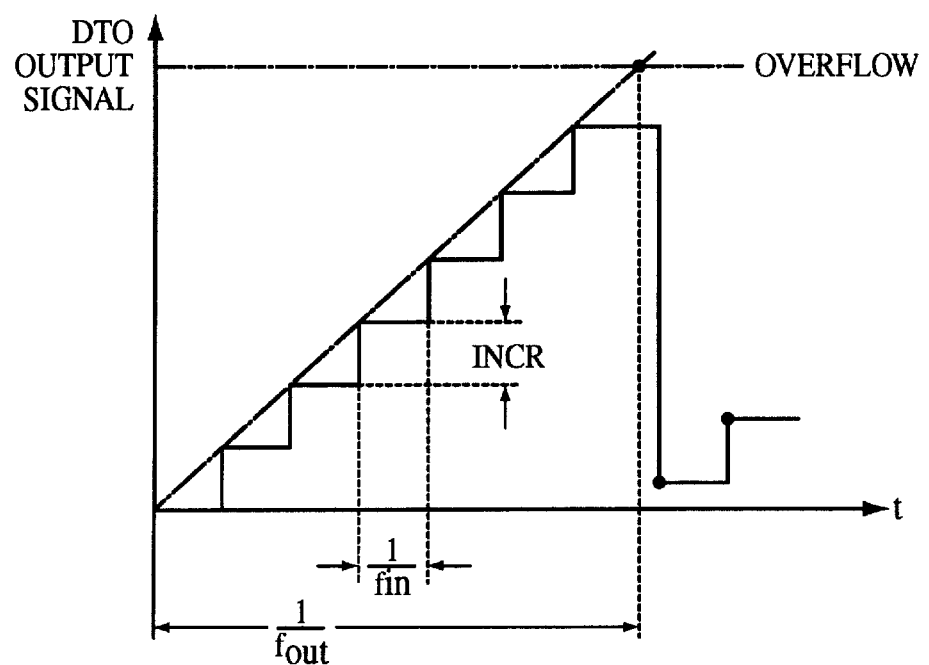
FIG. 2 shows the signal profile of a DTO output signal which is output by a conventional DT oscillator.
Figure 3:
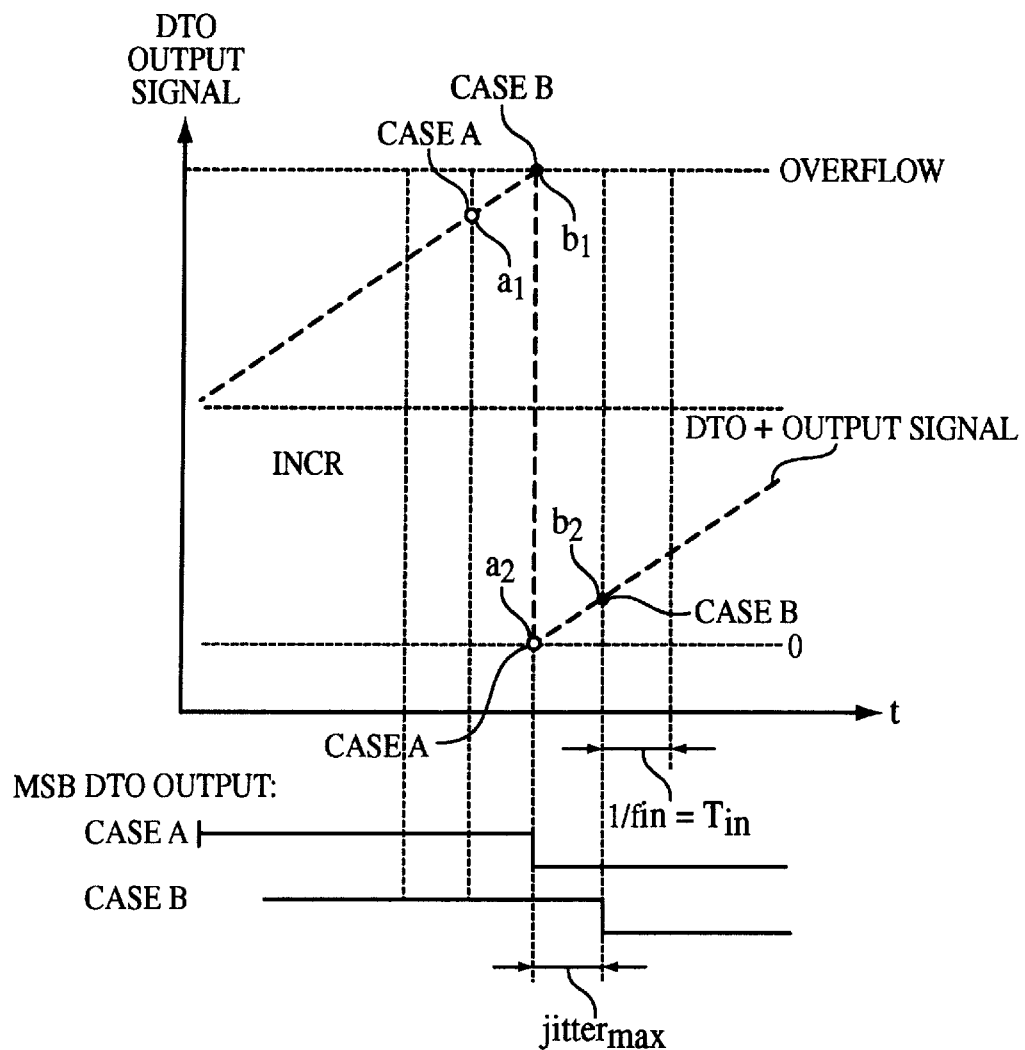
FIG. 3 shows the profile of a DTO output signal at the overflow time in order to explain the problems according to the invention.
Figure 4:
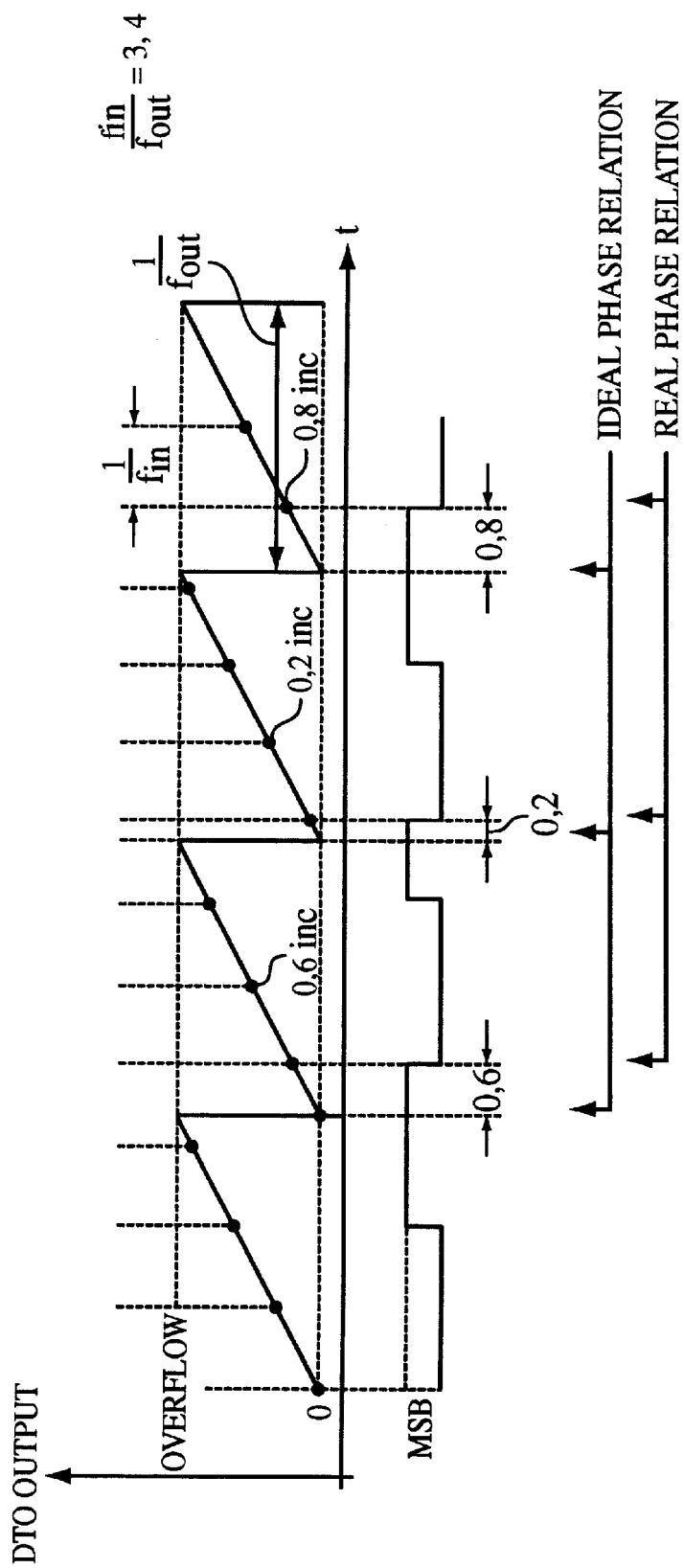
FIG. 4 shows an example of a DTO output signal and of the associated profile of the most significant bit in order to represent the phase jitter occurring at a conventional DT oscillator.
Figure 5:
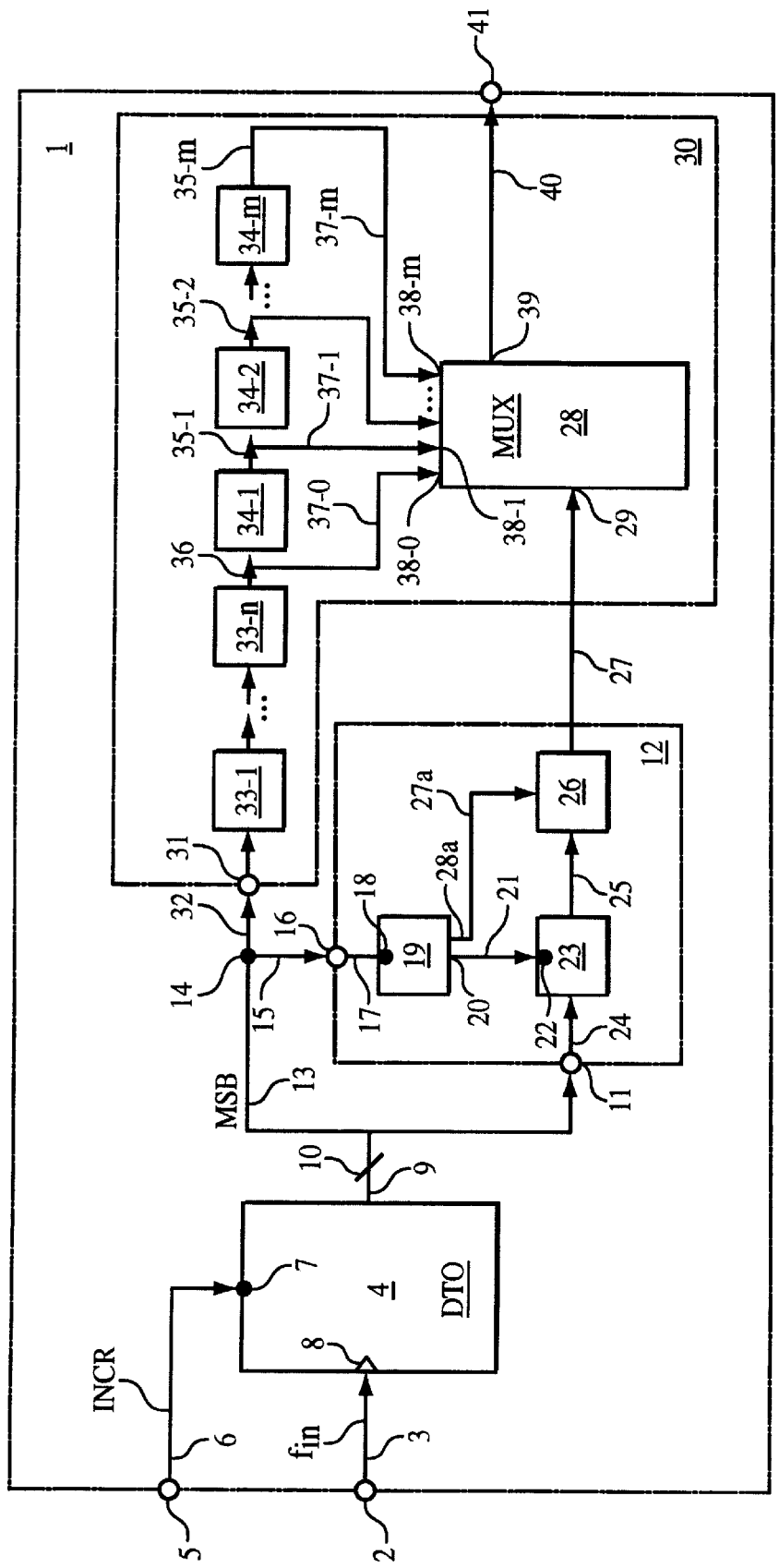
FIG. 5 shows a first embodiment of the clock signal generator according to the invention for generating a clock signal with minimum phase jitter.

FIG. 5 shows a first embodiment of the clock signal generator according to the invention for generating a clock signal with a minimum phase jitter. The clock signal generator 1 according to the invention has a clock signal input 2 for applying an input clock signal with an input clock frequency $f_{in}$. The input clock signal which is present at the clock signal input 2 is, for example, generated by means of a quartz oscillator and an analog pLL circuit. The input clock signal clocks, by means of an internal clock line 3, a DT oscillator 4 which has the circuit design shown in FIG. 1. The clock signal generator 1 also has a further signal input 5 to which an adjustable incremental value for the DT oscillator 4 is applied.

The incremental signal input 5 is connected via an internal line 6 to an input 7 of the DT oscillator 4. The DT oscillator 4 is clocked with the input clock signal which is present at its clock input 8, and generates a periodic digital DTO output signal at its output terminal 9.

The DT oscillator 4 contains an accumulator for adding the digital incremental value which is present at the input 7 to a buffered, accumulated digital value which is present at a second signal input of the accumulator. Here, the accumulated digital value is buffered in an internal register of the DT oscillator 4 whose register output is connected to the second signal input of the accumulator. The register of the DT oscillator 4 is clocked by means of the input clock signal which is present at the clock input 8 and has the input clock frequency $f_{in}$ in order to generate the digital DTO output signal which is present at the signal output 9.

The digital output signal has a plurality of data bits which are fed via separate internal digital lines 10 to a signal input 11 of a phase displacement calculation unit 12. The phase displacement calculation unit 12 is used to calculate the phase displacement between the signal phase of the DTO output signal and the second phase of the most significant bit MSB of the DTO output signal. For this purpose, the digital signal line 13 of the most significant bit MSB of the digital output signal is branched at a signal node 14 and fed via a line 15 to a further input 16 of the phase displacement calculation unit 12. The input 16 is connected via an internal line 17 of the phase displacement calculation unit 12 to the input 18 of a digital derivative unit 19.

The digital derivative unit 19 has a plurality of gates and a register which is clocked by the input clock signal. The digital derivative unit 19 is designed in such a way that it generates a clock pulse at a signal output 20 at each signal edge of the most significant bit MSB of the DTO output signal.

The output 20 of the digital derivative unit 19 is connected via an internal line 21 to a signal input 22 of a latch circuit 23 which is connected via internal signal lines 24 to the signal input 11 in order to buffer the DTO output signal. The buffering process is carried out with clocking by means of the clock pulses which are generated by the digital derivative unit 19. At the output end, the latch circuit 23 is connected via internal lines 25 to a logic circuit 26.

The logic circuit 26 receives, from a second signal output 28a of the digital derivative unit 19 via a signal line 27a, a signal edge indicating signal which indicates, at each signal edge of the most significant bit MSB of the DTO output signal, whether the signal edge is a rising or falling signal edge. The logic circuit 26 subtracts, as a function of the received signal edge indicating signal, half the overflow value of the DT oscillator 4, from the DTO output signal which is buffered in the latch circuit 23 or not. The incremental value for calculating the phase displacement signal is subsequently divided by the result of the subtraction. The phase displacement signal indicates the phase displacement between the phase of the DTO output signal which is present on the lines 10, and the signal phase of the most significant bit MSB of the DTO output signal which is present on the signal line 13. The phase displacement signal which is generated by the logic circuit 26 controls a multiplexer 28 via a control line 27 by means of the control input 29 of said multiplexer 28.

The multiplexer 28 forms part of a phase displacement reduction unit 30 for reducing the phase displacement between the signal phase of the DTO output signal and the signal phase of the most significant bit MSB of the DTO output signal.

The phase displacement reduction unit 30 has a signal input 31 which is connected via a line 32 to the branching node 14. The signal input 31 of the phase displacement reduction unit 30 thus receives the most significant bit MSB of the digital DTO output signal. Connected downstream of the signal input 31 is a register chain 33 which is composed of a plurality of registers 31-1 to 33-n. The registers 33-1 to 33-n of the register chain 33 are clocked by means of the input signal. The register chain 33 delays the bit signal, which is present at the signal input 31, of the most significant bit MSB of the DTO output signal in accordance with the signal delays calculated in the phase displacement calculation unit 12. The number of registers 33-1 to 33-n in the register chain 33 is selected in such a way that the signal transit times are compensated within the phase displacement calculation unit 12.

In the first embodiment (shown in FIG. 5) of the clock signal generator according to the invention, the signal, delayed by the register chain 33, of the most significant bit MSB of the DTO output signal is applied to a delay line 34, comprised of a plurality of delay elements 34-1 to 34-m, of the phase displacement reduction unit 30. The delay elements 34-1 to 34-m are connected in series and have delay element outputs 35-1 to 35-m. The output 36 of the last register 33-n of the register chain 33 and the signal outputs 35-1 to 35-m of the delay elements 34 are connected via signal lines 37-0 to 37-m to multiplexer inputs 38-0 to 38-m of the multiplexer 28.

The multiplexer 28 of the phase displacement reduction unit 30 connects through one of the multiplexer inputs 38 to its multiplexer signal output 39 as a function of the phase displacement signal which is present at the multiplexer control input 28. The multiplexer signal output 39 is connected via an internal line 40 to the clock signal generator output 41 of the clock signal generator 1.

The delay elements 34-1 to 34-m of the delay line 34 are either delay elements of analog design or delay elements of digital design, which are clocked with the input clock signal.

The phase displacement calculation unit 12 calculates the phase displacement Δt between the ideal phase of the DTO output signal and the real phase of the most significant bit MSB of the DTO output signal in accordance with equation (3) from the DTO output digital value according to the overflow $DTO_{n0}$, the incremental value which is set and the clock period $T_{in}$ of the input clock signal. The calculated phase displacement signal is applied via the signal line 27 to the control input 29 of the multiplexer 28 which connects through the MSB bit signal delayed by the delay line 34 to the clock signal generator output 41 of the clock signal generator 1 as a function of the phase displacement control signal which is applied. Here, the delay resulting from the delay line 34 corresponds to the calculated phase displacement. The higher the number of delay elements selected and the shorter the delay detected by the individual delay elements 34-1 to 34-m of the delay line 34, the closer the real phase relation of the MSB bit signal to the ideal phase relation of the DTO output signal, and the smaller the phase jitter which occurs.

$$\Delta t = t_{real} - t_{ideal} = T_{in} * DTO_{n0}/\text{incremental value} \quad (3)$$

For the chronological displacement after the DTO output signal value has exceeded the value ½*overflow value, the following applies:

$$[(\text{DTO value after half overflow}) - \tfrac{1}{2} * \text{overflow value}]/\text{incremental value} = \Delta t / T_{in} \quad (5)$$

In which case the following always applies:

$$[(\text{DTO value after half overflow}) - \tfrac{1}{2} * \text{overflow value}] < \text{incremental value} \quad (6)$$

The modulo property of the logic circuit 26 which is described in the equation (6) within the phase displacement calculation unit 12 can be utilized to reduce the expenditure for the logic circuit 26 in terms of circuitry. Because the incremental value is always much smaller than the overflow value, the necessary bit widths can be considerably reduced.

Figure 6:
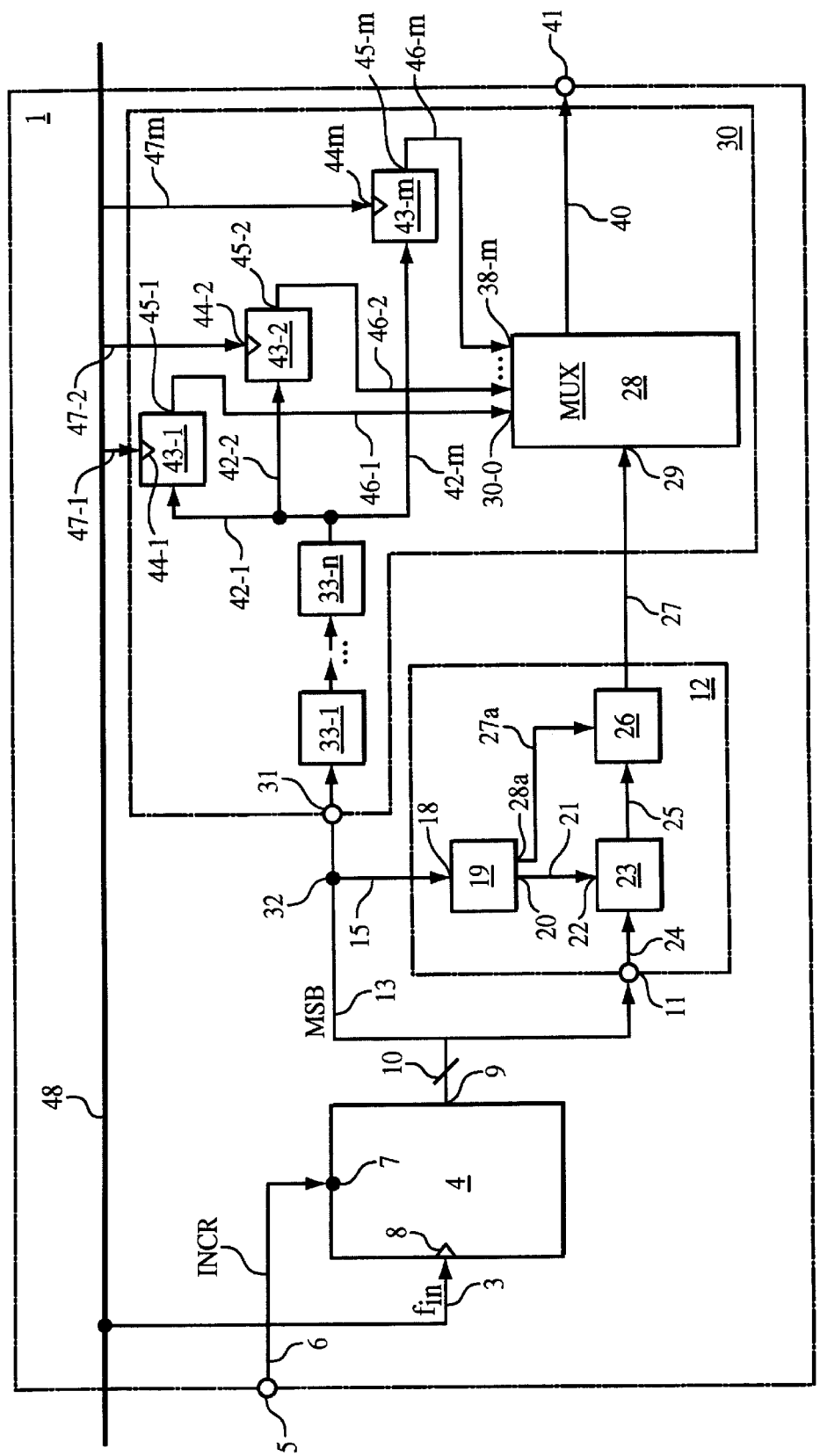
FIG. 6 shows a second embodiment of the clock signal generator according to the invention for generating a clock signal with minimum phase jitter.

FIG. 6 shows an alternative embodiment of the clock signal generator 1 according to the invention in which the phase displacement reduction unit 30 has a different circuit design from the first embodiment shown in FIG. 5. Here, the signal, delayed by the register chain 35, of the most significant bit MSB of the DTO output signal is applied in parallel by means of internal signal lines 42-1 to 42-m to latch circuits 43-1 to 43-m. The latch circuits 43 each have clock signal inputs 44-1 to 44-m and signal outputs 45-1 to 44-m. The signal outputs 45-1 to 45-m of the latch circuits 43-1 to 43-m are each connected via lines 46-1 to 46-m to the multiplexer inputs 38-0 to 38-m of the multiplexer 28.

The digital clock inputs 44-1 to 44-m of the latch circuits 43-1 to 43-m are connected via clock signal lines 47-1 to 47-m to multiphase clock lines 48. The multiphase clock lines 48 transmit m different clock signals which are each phase shifted with respect to one another by $T_{in/m}$. The first clock signal is used with its signal phase for clocking the DT oscillator 4 via the clock line 3. All the clock signals or signal phases are applied via the clock signal lines 47-1 to 47-m to a clock input 44-1 to 44-m of an associated latch circuit 43-1 to 43-m. The signal outputs 45-1 to 45-m of the latch circuits 43-1 to 43-m are phase shifted with respect to one another in accordance with the multiphase clock and are present at the signal inputs of the multiplexer 28. While the phase delay for compensating the phase displacement is generated by the delay elements 34-1 to 34-m within the phase displacement reduction unit 30 in the first embodiment shown in FIG. 5, in the second embodiment shown in FIG. 6 the clock signal generator 1 receives clock signals which are already phase shifted with respect to one another and which can be used to compensate the phase displacement.

Figure 7:
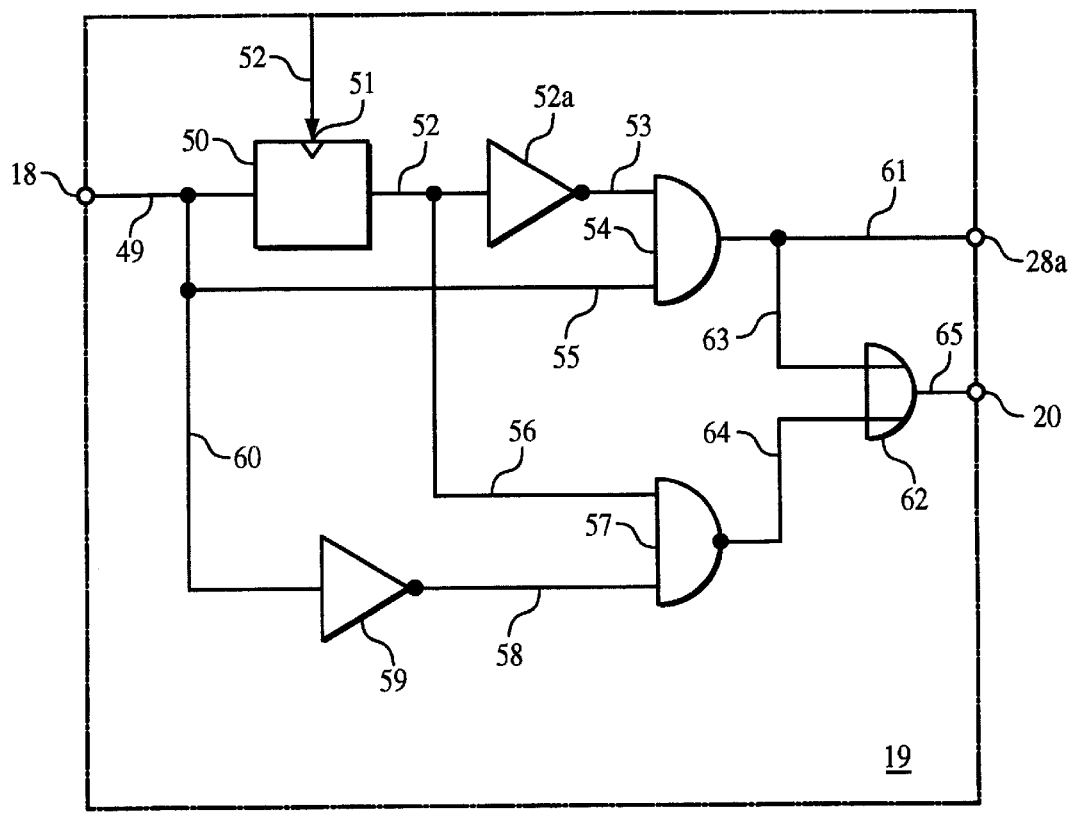
FIG. 7 shows a preferred embodiment of the digital derivative unit contained in the clock signal generator according to the invention.

FIG. 7 shows a preferred embodiment of the digital derivative unit 19 of the clock signal generator 1 according to the invention. The digital derivative unit 19 has a signal input 18 to which the most significant bit MSB of the DTO output signal is applied. The most significant bit MSB is fed via a line 49 to a clocked register 50 of the digital derivative unit 19, the register 50 having a clock signal input 51 to which the digital clock input signal is connected via a line 52. The register 50 is connected at the output end via a line 52 to an inverter 52a whose output is itself connected via a line 53 to a first input of an AND gate 54. The second input of the AND gate 54 is connected directly to the signal input 18 of the digital derivative unit 19 via a line 55.

In addition, the output of the register 50 is connected via a line 56 to a first input of an OR gate 57 which has a second signal input which is connected via a line 58 to the output of an inverter 59. The input of the inverter 59 is connected via a line 60 to the signal input 18 of the digital derivative unit 19.

The output of the AND gate 54 is connected directly to the output 28a of the digital derivative unit via a line 61 and outputs a signal edge indicating signal to the logic circuit 26 of the phase displacement calculation unit 12. The signal edge indicating signal at the output 28a of the digital derivative unit 19 is active if the signal of the most significant bit MSB at the signal input 18 has a rising signal edge. Furthermore, the digital derivative unit 19 has an OR gate 62 whose first input is connected via a line 63 to the output of the AND gate 54 and whose second output is connected via a line 64 to the output of the OR gate 57. At the output end, the OR gate 62 is connected via a line 65 to the signal output 20 of the digital derivative unit 19. The clock pulse which is generated at the signal output 20 of the digital derivative unit 19 is output to the latch circuit 23 of the phase displacement calculation unit 12 in order to clock it. Here, a clock pulse is generated at the signal output 20 of the digital derivative unit 19 at each rising or falling edge of the most significant bit MSB, present at the signal input 18, of the DTO output signal.

What is claimed is:

1. A clock-signal generator for generating a clock signal at a clock-signal generator output, the clock-signal generator comprising:
   a discrete timing oscillator that is clocked with an input clock signal and that generates a periodic digital DTO output signal,
   a phase displacement calculation unit for calculating the phase displacement between a signal phase of the DTO output signal and a signal phase of a most-significant-bit of the DTO output signal, the phase displacement calculation unit including a digital derivative unit that generates a clock pulse at each signal edge of the most-significant-bit of the DTO output signal, and
   a phase displacement reduction unit for reducing the phase displacement between the signal phase of the DTO output signal and the signal phase of the most-significant-bit of the DTO output signal as a function of a calculated phase displacement provided by the phase displacement calculation unit.

2. The clock-signal generator of claim 1, wherein the digital derivative unit comprises a plurality of gates and a register that is clocked by the input clock signal.

3. The clock-signal generator of claim 1, wherein the digital derivative unit is configured to generate a signal-edge indicating signal that indicates, at each signal edge of the most-significant-bit of the DTO output signal, whether the signal edge is a rising signal-edge or a falling signal-edge.

4. The clock-signal generator of claim 3, wherein the phase displacement calculation unit comprises a logic circuit that
   subtracts, from the DTO output signal buffered in a latch circuit, a quantity selected from the group consisting of half the overflow value or zero, the quantity being selected as a function of the signal-edge indicating signal, and
   subsequently divides the result of the subtraction by an incremental value to calculate a phase displacement signal indicative of the phase displacement between the signal phase of the DTO output signal and the signal phase of the most-significant-bit of the DTO output signal.

5. The clock-signal generator of claim 1, wherein the discrete timing oscillator comprises an accumulator for adding a digital incremental value present at a first signal input of the accumulator to a buffered, accumulated digital value present at a second signal input of the accumulator.

6. The clock-signal generator of claim 5, wherein the accumulator of the discrete timing oscillator cuts off an overflow at its output.

7. The clock-signal generator of claim 1, wherein the discrete timing oscillator comprises a register that is connected to a signal output of an accumulator for buffering an accumulated digital value.

8. The clock-signal generator of claim 7, wherein the register of the discrete timing oscillator is clocked by the input clock signal with an input clock frequency in order to generate the digital DTO output signal.

9. A clock-signal generator for generating a clock-signal at a clock-signal generator output, the clock-signal generator comprising:

a discrete timing oscillator that is clocked with an input clock signal and that generates a periodic digital DTO output signal, a phase displacement calculation unit for calculating the phase displacement between a signal phase of the DTO output signal and a signal phase of a most-significant-bit of the DTO output signal, the phase displacement calculation unit including a latch circuit for buffering the DTO output signal, and a phase displacement reduction unit for reducing the phase displacement between the signal phase of the DTO output signal and the signal phase of the most-significant-bit of the DTO output signal as a function of a calculated phase displacement provided by the phase displacement calculation unit.

10. The clock-signal generator of claim 9, wherein the latch circuit of the phase displacement calculation unit is clocked by the clock pulses generated by a digital derivative unit.

11. The clock-signal generator of claim 9, wherein the discrete timing oscillator comprises an accumulator for adding a digital incremental value present at a first signal input of the accumulator to a buffered, the accumulated digital value being present at a second signal input of the accumulator.

12. The clock-signal generator of claim 11, wherein the accumulator of the discrete timing oscillator cuts off an overflow at its output.

13. The clock-signal generator of claim 9, wherein the discrete timing oscillator comprises a register that is connected to a signal output of an accumulator for buffering an accumulated digital value.

14. The clock-signal generator of claim 13, wherein the register of the discrete timing oscillator is clocked by the input clock signal with an input clock frequency in order to generate the digital DTO output signal.

15. A clock-signal generator for generating a clock signal at a clock-signal generator output, the clock-signal generator comprising:

a discrete timing oscillator that is clocked with an input clock signal and that generates a periodic digital DTO output signal, a phase displacement calculation unit for calculation the phase displacement between a signal phase of the DTO output signal and a signal phase of a most-significant-bit of the DTO output signal; and a phase displacement reduction unit for reducing the phase displacement between the signal phase of the DTO output signal and the signal phase of the most-significant-bit of the DTO output signal as a function of a calculated phase displacement provided by the phase displacement calculation unit, the phase displacement reduction unit having a register chain to delay the signal of the most-significant-bit of the DTO output signal, the register chain having a plurality of registers connected in series.

16. The clock-signal generator of claim 15, wherein the registers of the register chain are configured to be clocked by the input clock signal.

17. The clock-signal generator of claim 15, wherein the signal of the most-significant-bit of the DTO output signal, which is delayed by the register chain, is applied to a delay line of the phase displacement reduction unit, the delay line including a plurality of delay elements.

18. The clock-signal generator of claim 17, wherein the phase displacement reduction unit comprises a multiplexer.

19. The clock-signal generator of claim 18, wherein the multiplexer of the phase displacement reduction unit comprises multiplexer inputs that are each connected to a delay element output of a delay element of the delay line.

20. The clock-signal generator of claim 19, wherein the multiplexer connects through the delay element output to the clock-signal generator output as a function of the phase displacement signal that is present at a multiplexer control input.

21. The clock-signal generator of claim 19, wherein the delay elements of the delay line comprise analog delay elements.

22. The clock-signal generator of claim 19, wherein the delay elements of the delay line are digital delay elements that are clocked with the input clock signal.

23. The clock-signal generator of claim 18, wherein the multiplexer of the phase displacement reduction unit comprises a multiplexer control input at which the phase displacement signal calculated by the phase displacement calculation unit is present.

24. The clock-signal generator of claim 18, wherein the signal of the most-significant-bit of the DTO output signal, which is delayed by the register chain, is applied in parallel with the control of latch circuits, each latch circuit having a clock input connected to a signal phase of a multi-phase clock and an output connected to an input of the multiplexer.

25. The clock-signal generator of claim 15, wherein the discrete timing oscillator comprises an accumulator for adding a digital incremental value present at a first signal input of the accumulator to a buffered, the accumulated digital value being present at a second signal input of the accumulator.

26. The clock-signal generator of claim 25, wherein the accumulator of the discrete timing oscillator cuts off an overflow at its output.

27. The clock-signal generator of claim 15, wherein the discrete timing oscillator comprises a register that is connected to a signal output of an accumulator for buffering an accumulated digital value.

28. The clock-signal generator of claim 27, wherein the register of the discrete timing oscillator is clocked by the input clock signal with an input clock frequency in order to generate the digital DTO output signal.

* * * * *